United States Patent [19]
Norberg

[11] 4,031,463
[45] June 21, 1977

[54] POWER BROWN-OUT DETECTOR

[75] Inventor: Gayle Russell Norberg, Columbia Heights, Minn.

[73] Assignee: Control Data Corporation, Minneapolis, Minn.

[22] Filed: Mar. 1, 1976

[21] Appl. No.: 662,315

[52] U.S. Cl. .............................. 324/77 A; 324/186; 328/109; 328/129; 307/360; 361/86
[51] Int. Cl.² ........................................ G01R 23/16
[58] Field of Search ................ 324/77 A, 186, 181, 324/78 R, 78 D, 77 G; 328/150, 109, 115, 135, 129; 317/31; 307/235 N

[56] References Cited
UNITED STATES PATENTS

| | | | |
|---|---|---|---|
| 3,327,230 | 6/1967 | Konian | 328/150 |
| 3,348,031 | 10/1967 | Russell, Jr. et al. | 324/77 A |
| 3,543,156 | 11/1970 | Hall et al. | 324/181 |
| 3,683,284 | 8/1972 | Mueller | 328/150 |
| 3,766,555 | 10/1973 | Watt | 324/186 |

*Primary Examiner*—Rudolph V. Rolinec
*Assistant Examiner*—Michael J. Tokar
*Attorney, Agent, or Firm*—Edward L. Schwarz

[57] ABSTRACT

Apparatus for computing an approximation of a running average of the peak voltage of an AC power wave. If this average drops below a predetermined level a brownout signal indicating potential failure of electronic units powered by the AC wave is generated.

11 Claims, 2 Drawing Figures

POWER BROWN-OUT DETECTOR

BACKGROUND OF THE INVENTION

1. Field of the Invention

The proper performance of almost all electronic and many electro-mechanical devices is critically dependent on the characteristics of the AC power voltage supplied to operate them. Usually, these devices have tolerance built into them, so that a decrease in RMS voltage of even as much as 10% to 15% of nominal will not affect operation. However, operation degrades very rapidly once the designed-for tolerance is exceeded. Particularly in recent years, line power has become unreliable in this respect, with voltage being either deliberately reduced in what is commonly now known as a "brownout" or through outright failure of line power in a blackout. In the case of electronic computers and their associated peripheral gear, it is important that both of these conditions be detected relatively rapidly so that computation which might otherwise proceed erroneously can be halted with orderly system shutdown procedures until proper line or auxiliary power is available. It has been found that a computer can operate satisfactorily with an occasional power cycle or half cycle which dips below minimum operating value if the overall average is at or above this value, because of power stored in the power supply capacitors. To treat a single isolated instance of an AC wave cycle whose voltage dips below the desired minimum as a blackout would result in unnecessary interruption of processing. On the other hand, a series of low voltage cycles has a cumulative effect by eventual partial discharge of power supply filter capacitors to too low a level. It is therefore desirable to suspend operation if too many low voltage cycles occur within any arbitrary time period.

2. Description of the Prior Art

Detection of deviations in an AC power wave from the nominal peak value has been done in a variety of ways. Blackout detection is old in the art and is based on the assumption that AC power has failed once peak or RMS voltage drops below a preselected level. This level is usually selected such that time remains for the computer to go through an orderly shutdown procedure, thereby minimizing difficulties upon restart. U.S. Pat. No. 3,758,852 shows one embodiment of such apparatus. Other related U.S. Patents are U.S. Pat. Nos. 3,401,308 and 3,700,919.

Another aspect of AC wave analysis related to this invention involves the so-called disturbance analyzers as manufactured by, for example, Dranetz Engineering Laboratories, South Plainfield, New Jersey. These are "stand-alone" devices which note occurrence of disturbances in the AC line wave and provide an appropriate indication or warning to the operator.

U.S. Pat. No. 3,534,403 discloses error detector logic somewhat similar to that employed by this invention. However, the use is to provide a noise or error filter, rather than to determine an error condition.

BRIEF DESCRIPTION OF THE INVENTION

The invention provides a warning or brownout signal which indicates a likelihood of low power in an AC wave. This condition is measured by analysis of the peak voltage attained by each half cycle. Every power supply is designed for an AC supply having a nominal peak voltage. Defective or "runt" half cycles are those whose peak is less than a predetermined percentage of nominal peak voltage. In this invention, each low voltage or runt half cycle causes the contents of a counter to be changed by a predetermined value. A perferred level for the peak voltage of any half cycle, below which the half cycle is classified as a runt is 90% of nominal. Each time the maximum voltage of a half cycle equals or exceeds the predetermined percentage of nominal, the counter contents are changed by a second predetermined value in the opposite direction unless the excess of good over runt half cycles is so great that the counter has reached a third predetermined value. If the count maintained in the counter ever reaches a fourth predetermined value because of a large number of runt half cycles, a brownout signal is issued. By proper choice of the first through fourth predetermined values, this apparatus can be made more or less sensitive to runt half cycles.

Accordingly, one object of this invention is to provide a brown-out warning insensitive to relatively rare runt half cycles in an AC wave.

A second object is to progressively increase sensitivity to low voltage half cycles as the density of low voltage half cycles increase.

Another object is to provide real/time monitoring of an AC wave.

Another object is to provide a warning signal while orderly shut-down of the installation is still possible.

A last object is to perform the function of a blackout detector as well.

DESCRIPTION OF THE PREFERRED EMBODIMENTS

Figure 1:
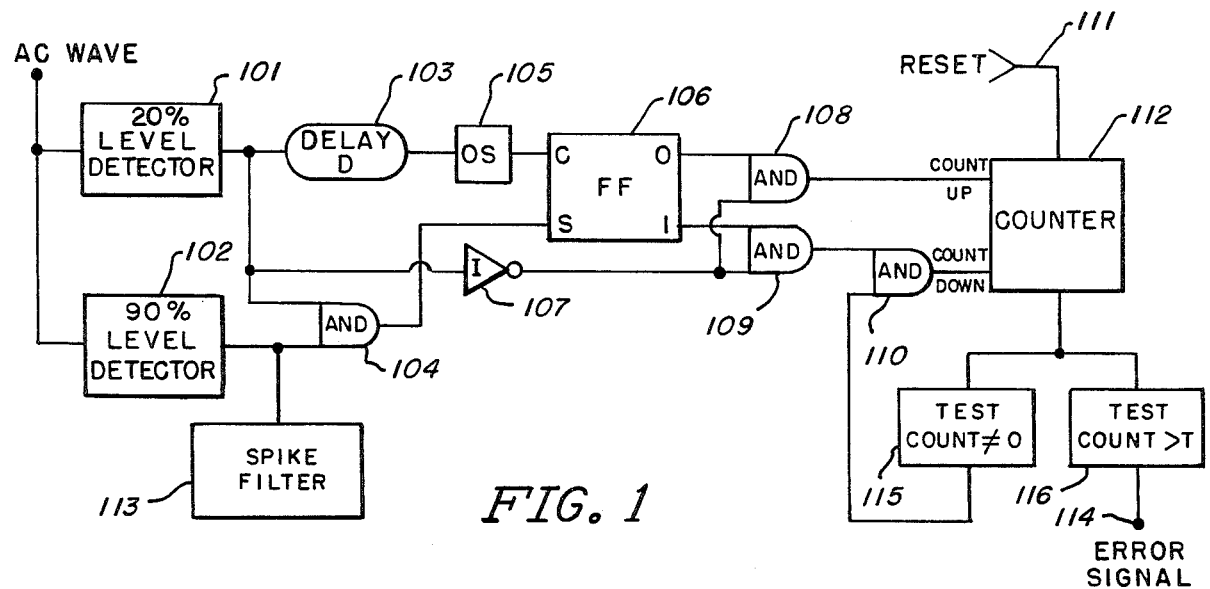
FIG. 1 is a logic diagram of a preferred embodiment of the invention.

Turning to the apparatus of FIG. 1, the AC wave to be monitored is supplied to the input terminals of 20% level detector 101 and 90% level detector 102. Waveform 200 in FIG. 2 generally represents the AC wave applied to these two level detectors. The remaining signals in FIG. 2 all may have one of two logic levels which can be conveniently referred to as the 0 or low level and the 1 or high level. The actual voltage associated with each of these levels in an operating circuit is immaterial. It is further assumed that circuit response time is negligible, a reasonable assumption considering the fact that a 60 hertz AC half cycle spans 8300 microseconds. 20% level detector 101 produces an output, shown as waveform 201, which is 0 when AC wave 200 voltage is within 20% of its 0 volt baseline, and a 1 output at all other times. Thus, negative-going half cycles produce the same type of detector 201 output that positive-going half cycles do. 20% level detector 101 serves to detect the presence of the half cycle. 90% level detector 102, whose output is shown as waveform 202, operates in a similar fashion, with its low output being generated while AC wave 200 is within 90% of its peak value, and its high output otherwise, and serves to distinguish good peak cycles from runt half cycles.

20% level detector 101 output is applied to the input of delay 103 and one input of AND gate 104. The output of delay 103 is applied to the input of one-shot 105, whose output is applied to the CLEAR (C) input of flip-flop 106. One-shot 105 is a circuit which produces, in response to a change in its input from 0 to 1, a change in output from 0 to 1 of preselected duration. The output of 90% level detector 102 is applied to the second input terminal of AND gate 104. Particularly during deterioration of AC wave 200, high frequency spikes may be present in the AC wave, which could pass through 90% level detector 102 and appear as a very short duration high signal at its output. Spike filter 113, connected between the output of 90% detector 102 and ground, removes these spikes, and may simply be a capacitor of proper value. The output of AND gate 104 is applied to the SET (S) input of flip-flop 106. The 0 and 1 outputs of flip-flop 106 are applied to, respectively, one input of AND gate 108 and one input of AND gate 109. The output of 20% level detector 101, is inverted by inverter 107 and applied to a second input of AND gates 108 and 109.

Counter 112 may have any convenient capacity. It is incremented by each low to high change at its COUNT UP input and decremented by each low to high change at its COUNT DOWN input. The amount of change in counter 112 contents responsive to a single pulse may differ for the two inputs and need not be 1. AND gate 108 output indicates too low half cycle power by supplying the COUNT UP inputs, and AND gate 109 indicates normal half cycles with COUNT DOWN inputs to counter 112 through inhibit AND gate 110. "TEST COUNT ≠ 0" circuit 115 receives the contents-indicating output of counter 112 and provides a 0 output if the contents of counter 112 are 0 and a 1 output otherwise. The output of TEST COUNT ≠ 0 circuit 115 is supplied to an input of AND gate 110 to inhibit any decrementing of counter 112 contents if it is already 0. The output of counter 112 is also applied to the input of "TEST COUNT > T" circuit 116, which supplies a 1 output on signal path 114 if the counter contents are greater than a predetermined value T, and a 0 output otherwise. The output of TEST COUNT > T circuit 116 is the desired brown-out signal. Count testing circuits 115 and 116 may both conveniently be multi-input AND gates.

This apparatus will not provide any indications of sub-20% half cycles. It is not intended to provide warning of a single grossly substandard pulse, one greater than 20% but having say, less than 80%, or possibly 85%, of the nominal peak voltage, although it will certainly flag a series of them. There are, however, substandard or runt pulses which if they are of infrequent occurrence are unlikely to cause errors and hence no warning signal with appropriate recovery procedures is necessary. The justification for this is that a typical power supply will maintain output DC voltage relatively close to the design value for a short period of time after slightly substandard AC power is applied to it, by discharge of its filter capacitors. If the peak voltage of incoming AC wave half cycles then increases, the capacitors will be be recharged to their normal levels and the DC output voltage will be only inconsequentially affected. This accomplishes the purpose of this invention, to detect marginal peak voltage in each individual AC wave half cycle and if the proportion of marginal to good half cycles is too great, to provide a warning signal.

Figure 2:
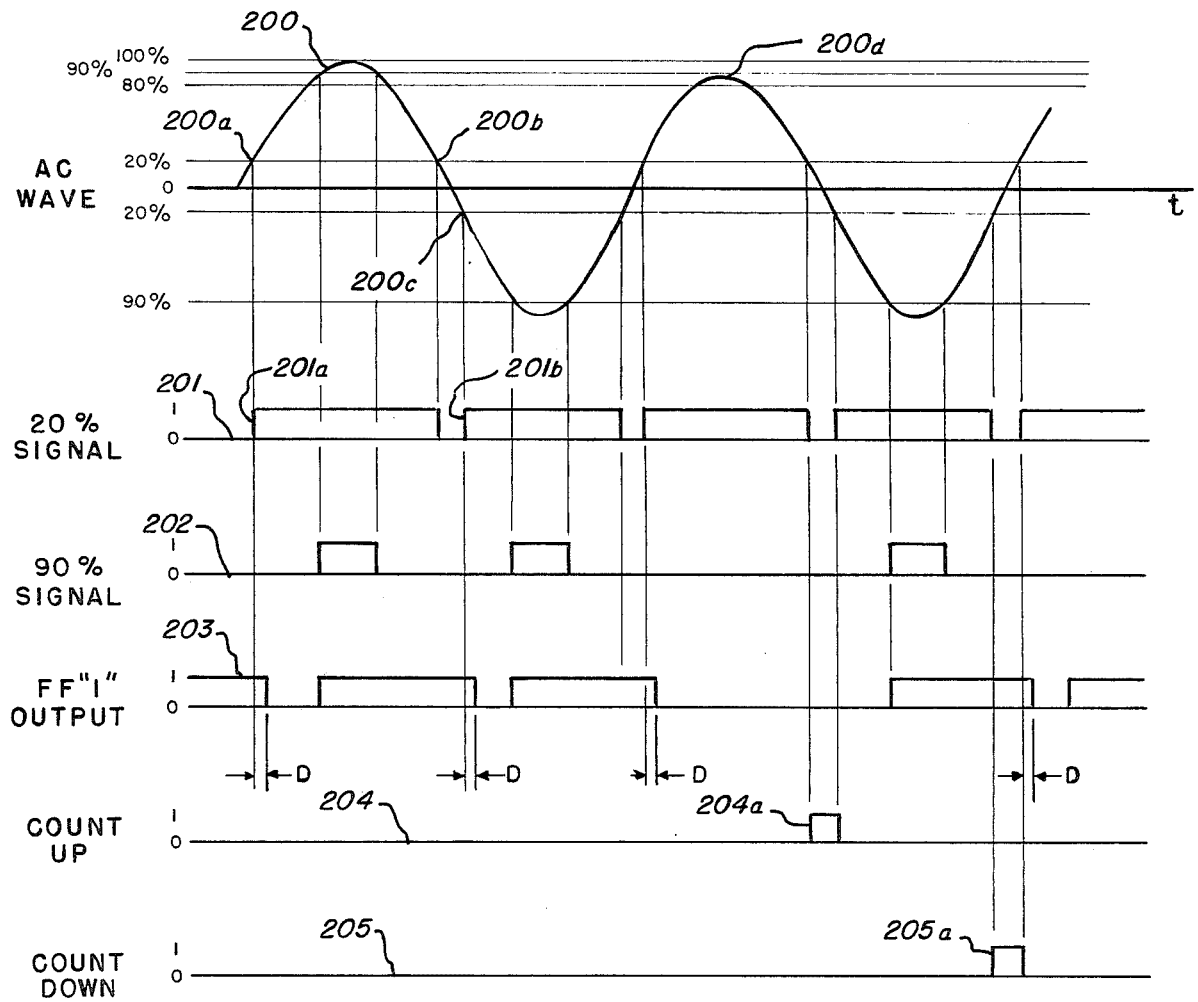
FIG. 2 is a timing graph of various signals associated with the apparatus of FIG. 1.

The operation of the apparatus of FIG. 1 can be more clearly explained by reference to the waveforms in FIG. 2. The output of 20% level detector 101 is shown as waveform 201. Waveform 201 comprises a series of square wave pulses, the leading and trailing edges of each positive pulse coinciding with the 20% points 200a, 200b, 200c, etc. of each half cycle of AC wave 200. Thus, if a particular AC wave was completely missed, no pulse in 20% signal 201 would occur during that half cycle. Similarly, 90% signal 202 is 0 when AC wave 200 voltage is less than 90% of peak voltage, and 1 otherwise. If a half cycle of AC wave 200, such as half cycle 200d, does not reach the 90% level, then no 90% signal pulse is produced during that half cycle.

The positive-going edges of the 20% signal pulses 201a, 201b, etc. are used to gate the 90% signal to flip-flop 106 through AND gate 104 and the flip-flop's outputs to counter 112 through AND gates 108 and 109. Delay 103 delays the application of the 20% signal to one-shot 105 for an interval D. The pulse produced by one-shot 105 responsive to the delayed 20% signal is long enough to clear flip-flop 106, but many times shorter than the time which elapses between the leading edges of adjacent 20% and 90% signal pulses. The delay time D of delay 103 need only be long enough to insure that the inverted output of 20% level detector 101 applied to the inputs of AND gates 108 and 109 has become 0 and disabled the gates before flip-flop 106 is cleared by one-shot 105 output. If flip-flop 106 is cleared before the 20% signal has propagated through invertor 107, a spurious COUNT UP input pulse might issue from AND gate 108. Thus, if inverter 107 is a fast response circuit and the response of one-shot 105 is slower, delay 103 in effect forms a part of one-shot 105, and separate provision for the function is unnecessary.

The 90% level detector 102 output is ANDed with the output of 20% level detector 101 to set flip-flop 106. If, however, AC wave 200 does not reach 90% of nominal peak voltage during a half cycle, as is the case with peak 200d, no pulse is present in 90% signal 202 for that half cycle. In this case flip-flop 106 is not set, as shown in flip-flop 1 output signal 203, and when 20% signal 201 becomes O on the trailing edge of AC half cycle 200d enabling AND gates 108 and 109, the COUNT UP input of counter 112 (pulse 204a) is activated to increment its contents. If, as is normally the case the 90% level is reached then counter 112 is counted down (pulse 205a) unless already 0, in which case TEST COUNT ≠ 0 circuit 115 has disabled AND gate 110, blocking the output of AND gate 109 from counter 112. Thus if no 90% signal pulse occurs during a particular 20% signal pulse, counter 112 contents are incremented by the design increment. Each time a 90% signal pulse does occur during a 20% signal, the counter is decremented by the design decrement unless the counter contents are already 0, in which case the counter contents are unchanged. If the number of runt pulses occurring over any series of half cycles causes the contents of counter 112 to extend T, then TEST COUNT > T circuit 116 output changes, indicating a brownout power failure. One feature of particular value in this invention is that the increment resulting from a COUNT UP signal input, the decrement resulting from a COUNT DOWN signal, and the threshold T in TEST COUNT > T circuit 116 can all be selected for the particular power supply and load involved. For example, if it is determined that a long term ratio of one sub-90% (runt) half cycle to four good half cycles is necessary for proper operation of the load, counter 112 can be designed such that each COUNT UP signal increases its contents by four and each COUNT DOWN signal decreases its contents by one. Choosing the threshold T = 9 insures that over the medium and long term this ratio of four good half cycles to one runt half cycle will not be exceeded without an indication, and yet provides a slight amount of tolerance if two runt half cycles occur consecutively. Alternatively, one might choose both values equal to 1, for another type of power supply and kind of load. It should be noted that a series of runt half cycles will increase sensitivity to a closely following more dense series of runt half cycles, thus simulating the typical performance of many types of rectifier power supplies when subject to subpar line power.

It is most convenient to choose increments and decrements to counter 112 as powers of two, since typical off-the-shelf counters operate binarily. Further flexibility in operation can be gained by varying the voltage level at which the 90% detector changes output level. A range of from 85% to 95% of peak voltage may be appropriate, depending on the power supply and load involved. (Of course, the term 90% detector becomes a misnomer if a level other than 90% is used.) Thus, by properly selecting these parameters a very flexible and powerful tool for easily discerning between brown-outs likely to cause improper operation and ignoring brown-out conditions unlikely to do so, is created.

What is claimed is:

1. Apparatus for providing a brownout signal indicating low power in an AC wave having a nominal peak voltage, and comprising
    a. voltage detecting means receiving the AC wave, for providing a low half-cycle signal each time the maximum AC wave excursion from 0 falls between a first predetermined voltage level and a second predetermined voltage level greater in magnitude than the first, and a normal half-cycle signal each time the maximum AC wave excursion is at least as great in magnitude as the second predetermined voltage level; and
    b. an accumulator receiving the low and normal half-cycle signals, comprising
        i. means responsive to an externally supplied reset signal, for setting the accumulator contents to a first preselected value,
        ii. means responsive to each low half-cycle signal, for changing the accumulator contents to decrease the difference between the accumulator contents and a second preselected value by a third preselected value,
        iii. means responsive to each normal half-cycle signal, for changing the accumulator contents to increase the difference between the accumulator contents and the second preselected value by a fourth preselected value whenever the accumulator contents are exclusively between the first and second preselected values, and
        iv. means for issuing the brownout signal whenever the difference between the second and first preselected values is exceeded by the difference between the accumulator contents and the first preselected value.

2. The apparatus of claim 1, wherein the voltage detecting means further comprises:
    a. first and second level detectors providing respectively a "half-cycle present" and a "good peak" signal pulse during the time the AC wave excursion exceeds, respectively, predetermined first and second percentages of the nominal peak value, said second percentage substantially exceeding the first;
    b. a first AND gate receiving the half-cycle present and good peak signal pulses;
    c. a time delay receiving the half-cycle present signal pulses and having a time constant substantially less than the interval between the leading edges of the half-cycle present and good peak signals in a normal AC wave half-cycle;
    d. a one-shot receiving the output of the time delay and having a set time substantially less than the interval between the leading edges of the half-cycle present and good peak signals in a normal AC wave half cycle;
    e. a flip-flop receiving the one-shot output at its clear terminal and the first ANd gate output at its set terminal; and
    f. second and third AND gates each having gate and signal inputs, and receiving the 0 and 1 outputs of the flip-flop, respectively on the signal input of each and the half-cycle present signal on the gate input of both, said AND gates being opened by the absence of the half-cycle present pulse, and the outputs of the second and third AND gates respectively providing the low half-cycle and normal half-cycle signals.

3. The apparatus of claim 2, wherein the first level detector provides the half-cycle present pulse whenever the AC wave excursion exceeds approximately 20% of the nominal peak value; and wherein the second level detector provides the good peak signal wheneveer the AC wave excursion exceeds approximately 90% of the nominal peak value.

4. The apparatus of claim 2, further comprising
    a. a fourth AND gate receiving as inputs the output of the third AND gate and an inhibit signal, and responsvie to the absence of the inhibit signal said gate being opened to and producing an output following the output of the third AND gate, and a fixed output responsive to presence of the inhibit signal;
    b. a counter having a count up input receiving the second AND gate output and responsive thereto incrementing its count by the third preselected value, and a count down input receiving the fourth AND gate output and responsive thereto decrementing its count by the fourth preselected amount, and producing an output specifying the count;
    c. a first count tester receiving the counter output and responsive to the count equaling the first preselected value, supplying the inhibit signal to the fourth AND gate; and
    d. a second count tester receiving the counter output and responsive to the count exceeding the second preselected value, issuing the brownout signal.

5. The apparatus of claim 4, wherein the first preselected value is 0, and the second preselected value is at least 8.

6. The apparatus of claim 4, wherein the third and fourth preselected values are 1.

7. The apparatus of claim 4, wherein the counter includes a reset input receiving the reset signal and responsive thereto setting its count to 0.

8. The apparatus of claim 4, wherein the third preselected value exceeds the forth preselected value.

9. The apparatus of claim 8, wherein the third preselected value is greater than 2 and the fourth preselected value is 1.

10. The apparatus of claim 4, wherein the first level detector provides the half-cycle present pulse whenever the AC wave excursion exceeds approximately 20% of the nominal peak value; and wherein the second level detector provides the good peak signal whenever the AC wave excursion exceeds approximately 90% of the nominal peak value.

11. The apparatus of claim 4, wherein the counter comprises a binary counter and each count tester comprises a multi-input AND gate, each gate input receiving a preselected output from a counter flip-flop.

* * * * *